United States Patent
Zhai

(10) Patent No.: US 10,261,158 B2
(45) Date of Patent: Apr. 16, 2019

(54) METHOD AND APPARATUS FOR ELIMINATING MOTION ARTIFACT IN MAGNETIC RESONANCE IMAGING

(71) Applicant: Shanghai United Imaging Healthcare Co., Ltd., Shanghai (CN)

(72) Inventor: Renkuan Zhai, Shanghai (CN)

(73) Assignee: Shanghai United Imaging Healthcare Co., Ltd. (CN)

( * ) Notice: Subject to any disclaimer, the term of this patent is extended or adjusted under 35 U.S.C. 154(b) by 1054 days.

(21) Appl. No.: 14/661,919

(22) Filed: Mar. 18, 2015

(65) Prior Publication Data

US 2015/0268324 A1 Sep. 24, 2015

(30) Foreign Application Priority Data

Mar. 18, 2014 (CN) .......................... 2014 1 0100421

(51) Int. Cl.
G01R 33/565 (2006.01)
G01R 33/56 (2006.01)
G01R 33/54 (2006.01)
G01R 33/561 (2006.01)

(52) U.S. Cl.
CPC .... G01R 33/56509 (2013.01); *G01R 33/5608* (2013.01); *G01R 33/5611* (2013.01)

(58) Field of Classification Search
CPC ............ G01R 33/5608; G01R 33/5611; G01R 33/56509
See application file for complete search history.

(56) References Cited

U.S. PATENT DOCUMENTS

2005/0100202 A1* 5/2005 Huang ............... G01R 33/5611
                                                        382/128
2014/0126796 A1* 5/2014 Chesneau .......... G01R 33/4824
                                                        382/131

* cited by examiner

*Primary Examiner* — Rishi R Patel
(74) *Attorney, Agent, or Firm* — St. Onge Steward Johnston & Reens, LLC

(57) ABSTRACT

Method and Apparatus for eliminating motion artifacts in magnetic resonance imaging are disclosed according to the present invention. The present invention relates to magnetic resonance imaging field. The method for eliminating motion artifacts in magnetic resonance imaging according to the present invention utilizes the concept of iterative approximation to control the difference between the data lines in the K-space caused by motions and allow the common features between the data lines to be remained, such that the motion artifacts in the reconstructed image are restrained and the motion artifacts caused under various circumstances are well restrained. Accordingly, the quality of the magnetic resonance imaging is improved.

12 Claims, 3 Drawing Sheets

METHOD AND APPARATUS FOR ELIMINATING MOTION ARTIFACT IN MAGNETIC RESONANCE IMAGING

FIELD OF THE INVENTION

The present invention relates to Magnetic Resonance Imaging (MRI) field, and more specifically, to method and apparatus for eliminating motion artifact in MRI.

BACKGROUND OF THE INVENTION

In MRI technology, a space stored with magnetic resonance signals is called K-space, which is a Fourier transform space. MRI signals, which are obtained via MRI scan, are filled in the K-space. A magnetic resonance image can be obtained via an inverse Fourier transform of the K-space data.

Motion interference has always been a headache to the MRI imaging quality. This is even more the case for scans of certain parts of body, such as heart, abdomen. Body breathing or heart beating may result in motion artifacts and thereby affecting the MRI imaging quality.

Currently, there are some approaches for eliminating motion artifacts in MRI, such as PROPELLER approach, which may to some extent mitigate the motion interference to the imaging and remove the motion artifacts. However, these approaches relates to motion of rigid bodies in a plane. For scans of some parts of the body, motions of non-rigid bodies or out-of-plane motions are the main factors affecting the imaging quality. However, these approaches are unable to solve these problems.

There are also some other approaches, such as flow compensation technique, which may be used to compensate the artifacts caused by the blood flow. However, these approaches are limited to applications under certain special circumstances (i.e., artifacts caused by the blood flow).

Overall, the existing approaches for eliminating the motion artifacts in magnetic resonance imaging are limited.

Accordingly, there is a need for a new method and apparatus for eliminating motion artifacts in magnetic resonance imaging so as to restrain the motion artifacts caused under various circumstances and thus improving the quality of magnetic resonance imaging.

SUMMARY OF THE INVENTION

The problem to be solved by the present invention is that the existing method for eliminating motion artifacts in magnetic resonance imaging is not able to effectively restrain the motion artifacts caused under various circumstances.

In order to solve the foregoing problem, there is provided a method for eliminating motion artifacts in magnetic resonance imaging according to the present invention. The method includes the following steps:

1) obtaining fully-sampled initial K-space data corresponding to a plurality of channels;

2) calculating combination coefficients based on the fully-sampled initial K-space data and determining $K_1$-space data based on the combination coefficients;

3) obtaining $K_2$-space data based on the initial K-space data and the $K_1$-space data, obtaining a $S_2$ image by transforming the $K_2$-space data to an image domain, obtaining a $S_{2'}$ image by extracting part of the errors caused during the determination of $K_1$-space data;

4) obtaining $K_3$-space data by transforming the $S_{2'}$ image to K-space domain, obtaining $K_4$-space data by subtracting the $K_3$-space data from the $K_1$-space data;

5) determining whether to perform a next iteration operation; making the $K_4$-space data new initial K-space data if a next iteration operation is determined to be performed, and returning to step 2);

6) obtaining a final image by transforming the $K_4$-space data to the image domain.

Optionally, the step of obtaining $K_2$-space data based on the initial K-space data and the $K_1$-space data comprises obtaining $K_2$-space data by subtracting the initial K-space data from the $K_1$-space data.

Optionally, the step of obtaining $K_4$-space data based on the $K_3$-space data and the $K_1$-space data comprises obtaining $K_4$-space data by subtracting the $K_3$-space data from the $K_1$-space data.

Optionally, the step of extracting part of the errors caused during the calculation of the $K_1$-space includes replacing the values of pixels in the $S_2$ image with zero so as to obtain the $S_{2'}$ image wherein the values of pixels in the $S_2$ image to be replaced are greater than a first threshold.

Optionally, the step of extracting part of the errors caused during the step of obtaining the $K_1$-space data includes replacing the values of pixels in the $S_2$ image with zero, and performing mean filtering so as to obtain the $S_2'$ image; wherein the values of pixels in the $S_2$ image to be replaced are greater than a first threshold.

Optionally, step 1) can be implemented by directly full-sampling the initial K-spaces for a plurality of channels; or under-sampling K-spaces for a plurality of channels and obtaining the fully-sampled initial K-spaces using a corresponding method.

Optionally, the corresponding method may be a parallel acquisition reconstruction method or semi-Fourier reconstruction method.

Optionally, step 2) includes the following sub-steps:

21) utilizing the initial K-space data to obtain the combination coefficients;

22) for each channel, using the same rule to divide the initial K-space data into a plurality of sub-K-space data, wherein the sub-K-space data are matrix structures which have the same size as the initial K-space data, and each sub-K-space data comprises parts of the sampled data derived from the initial K-space data and unsampled data to be filled;

23) utilizing the combination coefficients and sampled data in the sub-K-space data to fill the unsampled data in each sub-K-space;

24) combining the data in each filled sub-K-space and obtaining the $K_1$-space data.

Optionally, in step 21), the combination coefficients refer to the combination coefficients used in the parallel acquisition reconstruction method.

Optionally, in step 23), the data to be filled in each sub-K-space is filled using the parallel acquisition reconstruction method.

Optionally, the parallel acquisition reconstruction method may be GRAPPA method or SPIRiT method.

Optionally, the step 22) comprises dividing the initial K-space data for each channel into two sub-K-space data, wherein the sub-K-space data are matrix structures which have the same size as the initial K-space. The odd data lines in one of the two sub-K-space data correspond to the odd data lines in the initial K-space data, and the even data lines are the unsampled data to be filled out. The even data lines in the other sub-K-space data correspond to the even data lines in the initial K-space data, and the odd data lines are the unsampled data to be filled out.

Optionally, step 24) comprises calculating an average of each filled sub-K-space data, and using the average as the $K_1$-space data.

Optionally, the first threshold is the average of the values of the pixels in the $S_2$ image obtained via the current iteration.

Optionally, determining whether to perform a next iteration operation in step 5) comprises: pre-setting the number of iteration cycle, proceeding to perform iteration calculation and making the $K_4$-space data new initial K-space data and returning to step 2) if the preset number is not reached; stopping the iteration calculation and performing step 6) if the pre-set number is reached.

Optionally, determining whether to perform a next iteration operation in step 5) comprises setting a second threshold; proceeding the iteration calculation and making the $K_4$-space data new initial K-space data and returning to step 2) if a standard deviation of the values of the pixels in the $S_2$ image obtained via the current iteration is no less than the second threshold; stopping the iteration calculation and performing step 6) if the standard deviation of the values of the pixels in the $S_2$ image obtained via the current iteration is less than the second threshold.

Optionally, the first threshold is 30% of the standard deviation of the values of the pixels in the $S_2$ image obtained via the first iteration.

Optionally, the K-space data may be transformed to the image domain via inverse Fourier Transformation and the image may be transformed to the K-space domain via the Fourier Transformation.

There is further provided an apparatus for eliminating motion artifacts in magnetic resonance imaging according to the present invention. The apparatus includes a sampling unit, a $K_1$-space obtaining unit, a $S_{2'}$ image obtaining unit, a $K_4$ space obtaining unit, an iteration determination unit and an image obtaining unit.

The sampling unit is configured to obtain fully-sampled initial K-space data corresponding to a plurality of channels.

The $K_1$-space obtaining unit coupled to the sampling unit is configured to calculate combination coefficients based on the fully-sampled initial K-space data and obtain $K_1$-space data based on the combination coefficients.

The $S_{2'}$ image obtaining unit coupled to the $K_1$-space obtaining unit is configured to obtain a $K_2$-space based on the initial K-space data and the $K_1$-space data, obtain a $S_2$ image by transforming the $K_2$-space data to an image domain, and obtain a $S_{2'}$ image by extracting part of the errors caused during the step of obtaining of the $K_1$-space data.

The $K_4$ space obtaining unit coupled to the $S_{2'}$ image obtaining unit is configured to obtain $K_3$-space data by transforming the $S_{2'}$ image to K-space domain and obtain $K_4$-space data based on the $K_3$-space data and the $K_1$-space data.

The iteration determination unit coupled to the $K_1$-space obtaining unit and the $K_4$-space obtaining unit is configured to determine whether to perform a next iteration operation.

The image obtaining unit coupled to the iteration determination unit is configured to transform the $K_4$-space data to the image domain to obtain a final image.

The present invention has the following advantages over the prior art. That is, the present invention utilizes the concept of the iterative approximation to control or even eliminate the difference between the data lines in the K-space caused by the motion and allow the common features between the data lines to be remained, such that the motion artifacts in the reconstructed image are restrained and the motion artifacts caused under various circumstances are well restrained. Accordingly, the quality of the magnetic resonance imaging is improved.

DETAILED DESCRIPTION OF THE INVENTION

The purposes, features and advantages concerning the present invention will become more readily appreciated by reference to the following detailed description of the embodiments, when taken in conjunction with the accompanying drawings.

Figure 1:
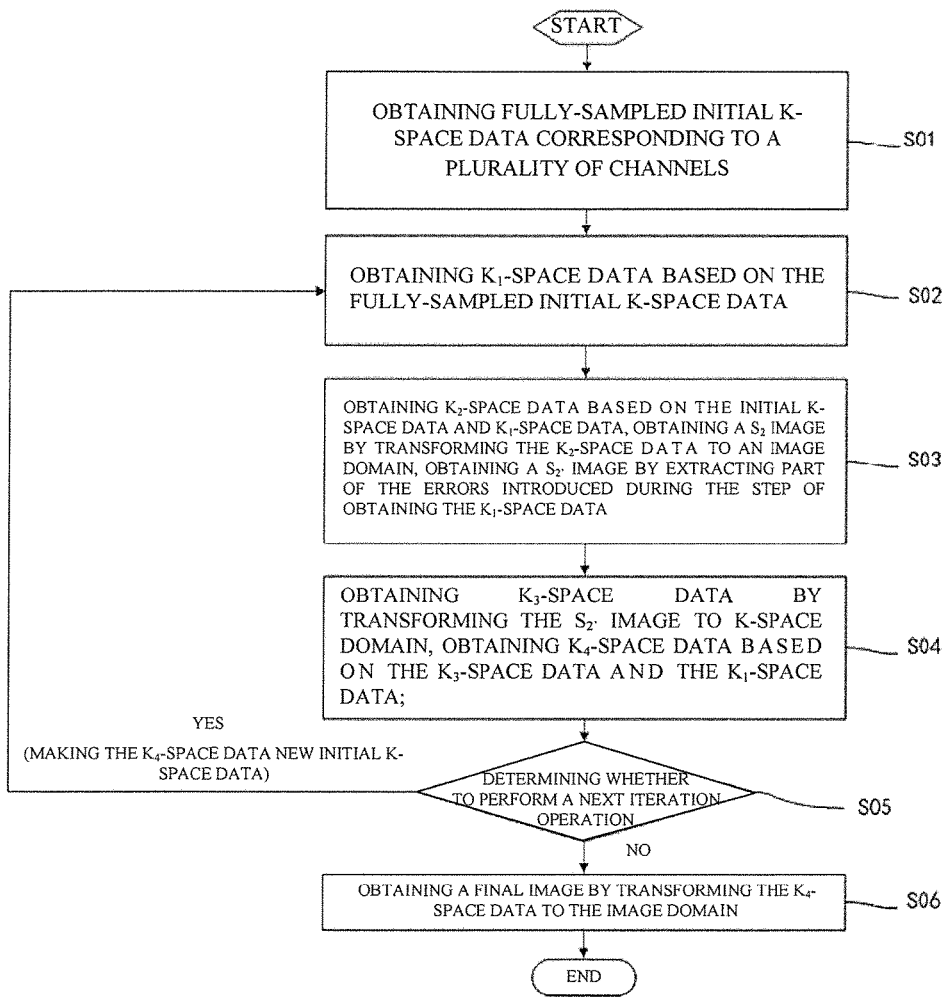
FIG. 1 illustrates a flowchart of a method for eliminating motion artifacts in magnetic resonance imaging according to the present invention.

As shown in FIG. 1, the method for eliminating motion artifacts in magnetic resonance imaging includes the following steps.

Step S01 is performed by obtaining fully-sampled initial K-spaces for a plurality of channels. The fully-sampled initial K-space can be obtained by the following ways: directly fully-sampling the initial K-spaces for the plurality of channels; or under-sampling the K-spaces for the plurality of channels and obtaining the fully-sampled initial K-spaces using a corresponding method.

The corresponding method can be an existing method for filling the under-sampled K-space data and can also be other methods.

Specifically, the corresponding method may be, but not limited to, a parallel acquisition reconstruction method or semi-Fourier reconstruction method.

In the present embodiment, the fully-sampled initial K-space data is denoted as "$S_0$" for brevity hereinafter.

Step S02 is performed by determining a combination coefficient $C_0$ based on the fully-sampled initial K-space $S_0$ and determining a $K_1$-space based on the combination coefficient.

Specifically, a parallel acquisition reconstruction method can be used to compute the combination coefficient and obtaining the $K_1$-space data. The parallel acquisition reconstruction method may be, but not limited to, GRAPPA (Generalized Auto-calibrating Partially Parallel Acquisitions) method or SPIRiT method.

The parallel acquisition reconstruction method involves filling the K-space data in the existing process of eliminating the motion artifacts in magnetic resonance imaging, which is known by a skilled person. GRAPPA method is taken below as an example for illustration of the parallel acquisition reconstruction method.

Figure 2:
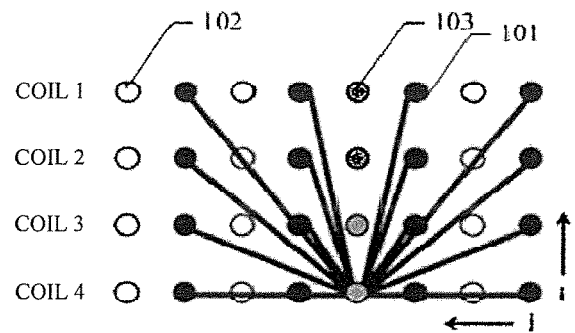
FIG. 2 illustrates a schematic of GRAPPA approach.

K-space can be divided into a phase encoding (PE) direction and a read-out (RO) direction. As shown in FIG. 2, the horizontal direction represents the phase encoding direction and the vertical direction represents the number of channels. The direction perpendicular to the paper is the read-out direction (a dot in FIG. 2 can be regarded as a data line in the K-space). The black solid dots 101 denote the actually sampled K-space data. The white hollow dots 102 denote un-sampled data which needs to be filled. The grey solid dots 103 denote data which are to be fitted. In GRAPPA method, any white hollow dot 102 in the figure can be represented by linear addition of the adjacent black solid dots 101. This equals to the combination of data from a plurality of coils. As shown in FIG. 2, the combination coefficient $n_{ij}$ which corresponds to coil i, position j can be determined by the black solid dots 101 best fitting the grey dots 103. In GRAPPA method, the data in the fully-sampled area in the K-space can be used as the calibration data (i.e., the block solid dots 101 and the grey solid dots 103 in FIG. 2 can be used as the calibration data). By calculating the fitting between the data lines in the calibration data, all the combination coefficients can be obtained. After the combination coefficients are determined, coils can be combined based on the combination coefficients and other sampled data, and the un-sampled data (to be filled) in the K-space, as denoted by white hollow dots 102, are filled.

Specifically, step S02 may include the following sub-steps.

Step S021 is performed by utilizing the initial K-space data as the calibration data to determine the combination coefficients.

Step S022 is performed by dividing the initial K-space into a plurality of sub-K-spaces (also referred to as divided K-spaces) for each channel with a same rule and obtaining a plurality of sub-K-spaces. Each sub-K-space is a matrix structure which has the same size as the initial K-space. Each sub-K-space includes parts of the sampled data points and the unsampled data to be filled.

Preferably, the initial K-space $S_0$ for each channels are pre-divided in the following ways.

Figure 3:
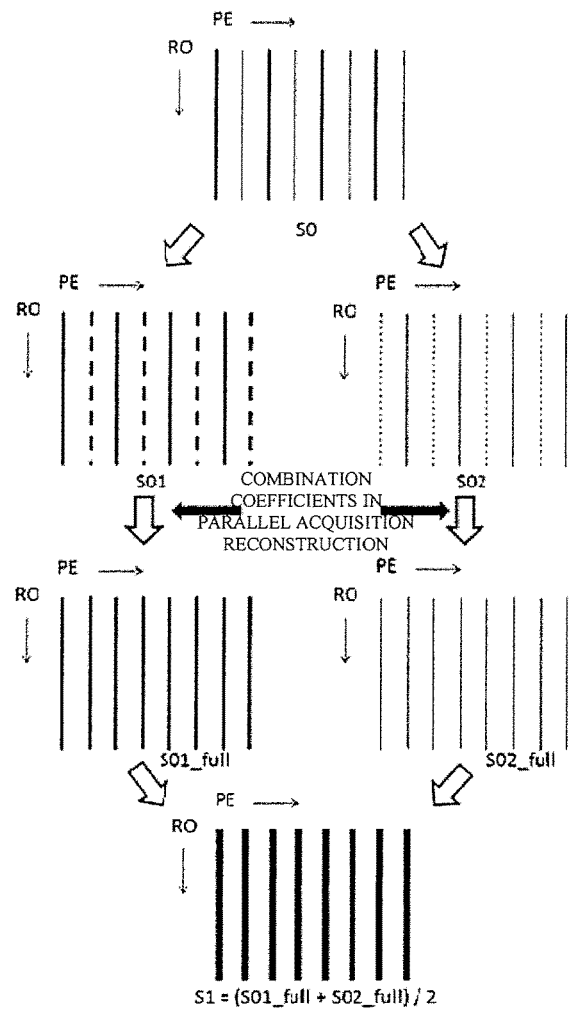
FIG. 3 illustrates a schematic of a detailed process of step S02 in the method for eliminating motion artifacts in magnetic resonance imaging according to the present invention.

As shown in FIG. 3, the two-dimensional K-space may be divided into a phase encoding (PE) direction and a read-out (RO) direction. A plurality of data lines arranged sequentially along the PE direction forms a complete K-space data. In the present embodiment, the initial K-space $S_0$ for each channel is divided into two sub-K-spaces $S_{01}$ and $S_{02}$. The sub-K-spaces $S_{01}$ and $S_{02}$ are matrixes which has the same size as the initial K-space $S_0$. The odd data lines in one of the sub-K-spaces ($S_{01}$) correspond to the odd data lines in the initial K-space $S_0$, and the even data lines are the unsampled data to be filled. The even data lines in the other sub-K-space ($S_{02}$) correspond to the even data lines in the initial K-space $S_0$, and the odd data lines are the unsampled data to be filled.

Step S023 is performed by utilizing the combination coefficients and sampled data in the sub-K-spaces to fill the unsampled data to be filled in each sub-K-space.

Preferably, as shown in FIG. 3, the even data lines in the sub-K-space $S_{01}$ is filled out using the parallel acquisition reconstruction method. The combination coefficient and the even data lines in the sub-K-space $S_{02}$ are used to fill out the odd data line in the K-space $S_{02}$ in accordance with the parallel acquisition reconstruction method. As such, two fully-sampled sub-K-spaces $S_{01\_full}$ and $S_{01\_full}$ are obtained, respectively.

Step S03 is performed by combining each filled sub-K-space data and obtaining the $K_1$-space data.

Preferably, as shown in FIG. 3, an average of the two filled sub-K-space data $S_{01\_full}$ and $S_{01\_full}$ is calculated. The average serves as $K_1$-space data $S_1$, i.e., $S_1=(S_{01\_full}+S_{02\_full})/2$.

Step S03 is performed by obtaining a $K_2$-space data $S_2$ by subtracting the initial K-space data $S_0$ from the $K_1$-space data $S_1$ (i.e., $S_2=S_1-S_0$), obtaining a $S_2$ image $ImS_2$ by transforming the $K_2$-space data $S_2$ to an image domain, obtaining a $S_{2'}$ image $ImS_{2'}$ by extracting part of the errors introduced during the calculation of $K_1$-space.

The method of extracting part of the errors introduced by algorithm during the calculation of the $K_1$-space may include, but not limited to, the following two approaches: replacing the values of pixels in the $S_2$ image, which are greater than a first threshold, with zero so as to obtain the $S_{2'}$ image; or replacing the values of pixels in the $S_2$ image, which are greater than a first threshold, with zero, and performing mean filtering so as to obtain the $S_{2'}$ image.

The method of transforming the $K_2$-space data to the image domain may be, but not limited to, an inverse Fourier transformation.

Preferably, the first threshold is the average of the values of the pixels in the $S_2$ image.

Step S04 is performed by transforming the $S_{2'}$ image $ImS_{2'}$ to K-space domain to obtain $K_3$-space data $S_3$ and subtracting the $K_3$-space data $S_3$ from the $K_1$-space data $S_1$ to obtain $K_4$-space data, i.e., $S_4=S_1-S_3$.

The method of transforming the $S_{2'}$ image $ImS_{2'}$ to K-space domain may be, but not limited to, a Fourier transformation.

Step S05 is performed by determining whether to perform iteration. If it is determined to perform the iteration, the $K_4$-space data is treated as the new initial K-space data, and step S02 is returned to. If it is determined not to perform the iteration, step S06 is performed.

The determination of whether to perform the iteration can be implemented with one of the following two methods.

1) pre-sett the number of iteration cycle. If the pre-set number is reached, stop the iteration and perform step S06;

2) set a second threshold. If a standard deviation of the values of the pixels in the $S_2$ image obtained via the current iteration is less than the second threshold, stop the iteration and perform step S06.

The second threshold may be a specific value or may be determined by the standard deviation of the values of the pixels in the $S_2$ image obtained via the first iteration.

Preferably, the second threshold is 30% of the standard deviation of the values of the pixels in the $S_2$ image obtained via the first iteration. That is, the iteration is stopped when the standard deviation of the values of the pixels in the $S_2$ image obtained via the current iteration is less than 30% of the standard deviation of the values of the pixels in the S2 image obtained via the first iteration.

Step S06 is performed by transforming the K4-space data S4 to the image domain to obtain a resulting magnetic resonance image.

Specifically, the method of transforming the K4-space data S4 to the image domain may be, but not limited to, an inverse Fourier transformation.

Advantages of the present invention and why such advantages can be achieved are detailed below.

In step S01, the obtained initial K-space data can be expressed as $S_0(k)=A(k)+B(k)+n$, where K denotes the $K^{th}$ data line in the K-space; A(k) denotes the signal when the object stands still, which is the desired signal in magnetic resonance image; B(k) denotes the signal generated due to motion interference; n denotes a noise signal. Since the influence caused by motion is changing every moment, the A(k) of the sampled data line of corresponding positions at different channels are consistent with each other and B(K) are different from each other.

Thus, there is need to a method for obtaining a new K-space where the signals generated due to motion interference can be reduced and thereby motion interference can be restrained.

Step S02 is performed so as to obtain the K1-space data $S_1(k)=A(k)+B'(k)+n+C(k)$. Since in step S02 a data line in the K1-space is determined by best fitting its neighboring data line, thus $B'(k)=\Sigma_{i=1}^n \alpha_i B(k+\Delta_i)$. That is, B'(k) represents the sum of convolutions of the motion of the neighboring data line. In magnetic resonance imaging, it can be approximately regarded that the difference made due to the motion of the neighboring data line can be counteracted by each other. Therefore, the motion difference reflected by B'(k) is less than B(k). C(k) denotes that the error introduced during the step of obtaining the K1-space.

In step S03, $K_2$-space data is obtained by subtracting the initial K-space data from the $K_1$-space data. That is, the $K_2$-space data is expressed as $S_2(k)=B'(k)+C(k)-B(k)$. $S_2$ image is then obtained by transforming the $K_2$-space data to the image domain. By replacing the values of pixels in the $S_2$ image which are greater than the first threshold with zero (and performing mean filtering), the error C(k) introduced during the step of obtaining the $K_1$-space can be extracted.

Therefore, in step S04, part of data in the K4-space is obtained $S_4(k)=A(k)+B'(k)+n$. The other part of the data is still $S_4'(k)=A(k)+B'(k)+n+C(k)$. Multiple subsequent iterations can be performed to eliminate the error C(k) from $S_4(k)$.

With the concept of iterative approximation, steps S02~S04 are iterated such that the resulting $K_4$-space data $S_4(k)$ will best approximate A(k). Consequently, the K-space data with motion restrained can be obtained. K-space data which are obtained via iteration are then used to reconstruct an image where motion artifacts are removed. Thus, the quality of the magnetic resonance imaging is improved.

Figure 4:
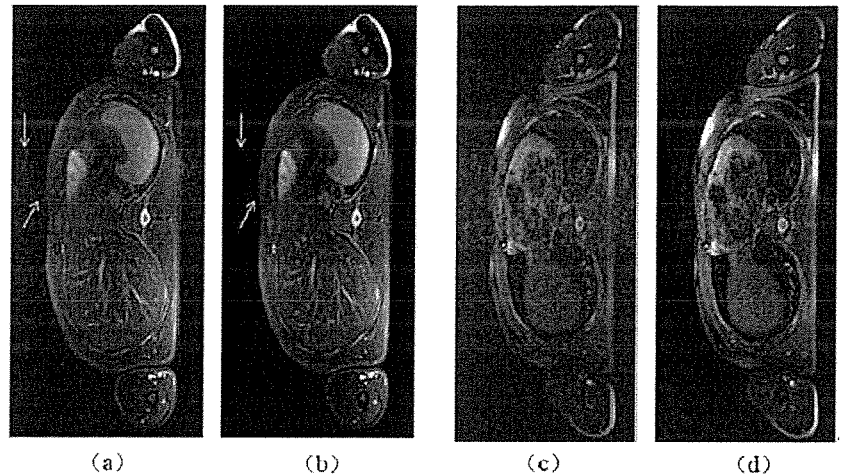
FIG. 4 illustrates a contrast between the image reconstructed without using the method of the present application and the image reconstructed using the method according to the present invention.

FIG. 4 (a) is an image obtained by a conventional image reconstruction method. That is, the image is obtained by transforming the initial K-space data obtained via sampling method directly to the image domain without using any method for eliminating motion artifacts. FIG. 4(b) is an image obtained by the image reconstruction method for eliminating motion artifacts in accordance with the present invention. As shown in FIG. 4(a) and FIG. 4(b), the image reconstruction method of the present invention has great advantages in eliminating artifacts caused by the motion indicated by the white arrow.

FIG. 4(c) is an image obtained by a conventional image reconstruction method in a heart beating scan. FIG. 4(d) is an image reconstructed by the image reconstruction method for eliminating motion artifacts in this scan image in accordance with the present invention. As shown in FIG. 4(c) and FIG. 4(d), the present invention has remarkable effect on eliminating artifacts caused by heart beating.

FIG. 4 indicates that the image reconstruction method according to the present invention has sound effect in restraining the motion artifacts under various circumstances.

Figure 5:
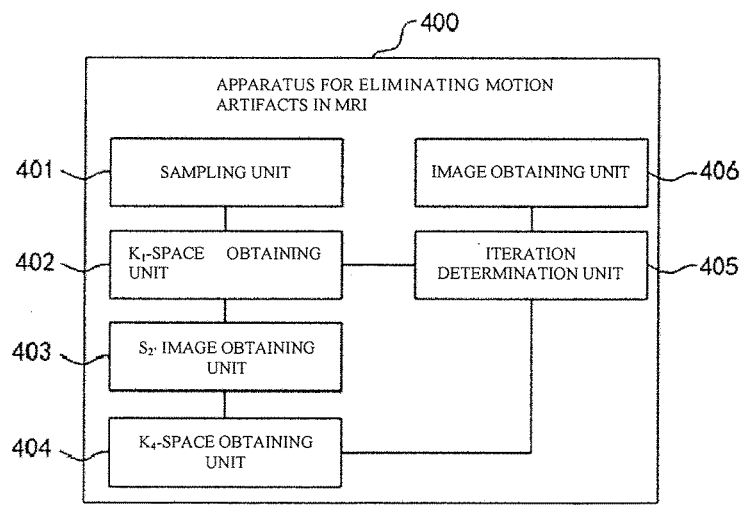
FIG. 5 illustrates a schematic of an apparatus for eliminating motion artifacts in magnetic resonance imaging according to the present invention.

There is further provided an apparatus for eliminating motion artifacts in magnetic resonance imaging according to the present invention. As shown in FIG. 5, the apparatus 400 for eliminating motion artifacts in magnetic resonance imaging according to the present invention includes a sampling unit 401, a $K_1$-space obtaining unit 402, the $S_{2'}$ image obtaining unit 403, the $K_4$-space obtaining unit 404, the iteration determination unit 405, and an image obtaining unit 406.

The sampling unit 401 is configured to obtain fully-sampled initial K-spaces corresponding to a plurality of channels.

The $K_1$-space obtaining unit 402 coupled to the sampling unit 401 is configured to calculate combination coefficients based on the fully-sampled initial K-space and obtain a $K_1$-space based on the combination coefficients.

The $S_{2'}$ image obtaining unit 403 coupled to the $K_1$-space obtaining unit 402 is configured to obtain a $K_2$-space by subtracting the initial K-space data from the $K_1$-space data, obtain a $S_2$ image by transforming the $K_2$-space to an image domain, and obtain a $S_{2'}$ image by extracting part of the errors introduced during the step of obtaining of the $K_1$-space.

The $K_4$-space obtaining unit 404 coupled to the $S_{2'}$ image obtaining unit 403 is configured to obtain $K_3$-space data by transforming the $S_{2'}$ image to K-space domain, and obtain $K_4$-space data by subtracting the $K_3$-space data from the $K_1$-space data.

The iteration determination unit 405 coupled to the $K_1$-space obtaining unit 402 and the $K_4$-space obtaining unit 404 is configured to determine whether to perform a next iteration.

The image obtaining unit 406 coupled to the iteration determination unit 405 is configured to transform the $K_4$-space data to the image domain to obtain a resulting image.

Although the present invention has disclosed the above content, the present invention is not limited by such disclosure. Any skilled person in the art is able to make various changes and modifications without departing from the spirit of the present invention. Therefore, any content without departing from the spirit of the present invention and any simple variation or equivalents or modification made to the foregoing embodiments in accordance with the technical substance of the present invention shall all fall within the scope of the present invention.

What is claimed is:

1. A method for eliminating motion artifacts in magnetic resonance imaging, comprising the following steps:
    1) obtaining fully-sampled initial K-space data corresponding to a plurality of channels;
    2) calculating combination coefficients based on the fully-sampled initial K-space data and obtaining $K_1$-space data based on the combination coefficients;
    3) obtaining $K_2$-space data based on the initial K-space data and the $K_1$-space data, obtaining a $S_2$ image by transforming the $K_2$-space data to an image domain, obtaining a $S_{2'}$ image by extracting part of the errors caused during the step of obtaining the $K_1$-space data;
    4) obtaining $K_3$-space data by transforming the $S_{2'}$ image to K-space domain, obtaining $K_4$-space data based on the $K_3$-space data and the $K_1$-space data;
    wherein an iteration operation is defined as including steps 2)-4);
    5) determining whether to perform a next iteration operation; making the $K_4$-space data new initial K-space data, if a next iteration is determined to be performed, and returning to step 2);
    6) obtaining a final image by transforming the $K_4$-space data to the image domain;
    wherein obtaining $K_2$-space data based on the initial K-space data and the $K_1$-space data comprises obtaining $K_2$-space data by subtracting the initial K-space data from the $K_1$-space data.

2. The method of claim 1, wherein obtaining $K_4$-space data based on the $K_3$-space data and the $K_1$-space data comprises obtaining $K_4$-space data by subtracting the $K_3$-space data from the $K_1$-space data.

3. The method of claim 1, wherein extracting part of the errors caused during the step of obtaining the $K_1$-space data comprises replacing values of pixels in the $S_2$ image with zero so as to obtain the $S_{2'}$ image, wherein the values of pixels in the $S_2$ image to be replaced are greater than a first threshold.

4. The method of claim 1, wherein extracting part of the errors caused during the step of obtaining the Ki-space data comprises replacing the values of pixels in the S2 image with zero, and performing mean filtering so as to obtain the S2' image, wherein the values of pixels in the S2 image to be replaced are greater than a first threshold.

5. The method of claim 1, wherein step 2) comprises the following sub-steps:
   21) utilizing the initial K-space data to obtain the combination coefficients for a parallel acquisition reconstruction method;
   22) for each channel, dividing the initial K-space data into a plurality of sub-K-space data, wherein the sub-K-space data are matrix structures with a size which is the same as a size of the initial K-space data, and each sub-K-space data comprises portions of the sampled data derived from the initial K-space data and unsampled data to be filled;
   23) utilizing the combination coefficients and the sampled data in the sub-K-space data to fill the unsampled data by the parallel acquisition reconstruction method;
   24) combining each filled sub-K-space data and obtaining the $K_1$-space data.

6. The method of claim 5, wherein the step 22) comprises dividing the initial K-space data for each channel into two sub-K-space data, wherein the sub-K-space data are matrix structures with a sub-K-space data size which is the same as the size of the initial K-space data; wherein odd data lines in one of the sub-K-space data correspond to odd data lines in the initial K-space data, and even data lines of the one of the sub-K space data are the unsampled data to be filled; wherein even data lines in the other sub-K-space data correspond to even data lines in the initial K-space data, and odd data lines of the other one of the sub-K space data are the unsampled data to be filled.

7. The method of claim 5, wherein the step 24) comprises calculating an average value of each filled sub-K-space data, and using the average value as the $K_1$-space data.

8. The method of claim 3, wherein the first threshold is an average value of the values of the pixels in the $S_2$ image obtained via the iteration operation.

9. The method of claim 1, wherein determining whether to perform a next iteration operation in step 5) comprises: pre-setting a number of iteration cycle to define a preset number, proceeding to perform the iteration operation and making the $K_4$-space data new initial K-space data and returning to step 2) if the preset number is not reached; stopping the iteration operation and performing step 6) if the pre-set number is reached.

10. The method of claim 1, wherein determining whether to perform a next iteration operation in step 5) comprises setting a second threshold; proceeding with the iteration operation and making the $K_4$-space data new initial K-space data and returning to step 2) if a standard deviation of the values of pixels in the $S_2$ image obtained via a current iteration operation is no less than the second threshold; stopping the iteration operation and performing step 6) if the standard deviation of the values of the pixels in the $S_2$ image obtained via the current iteration operation is less than the threshold.

11. The method of claim 10, wherein the second threshold is 30% of the standard deviation of the values of the pixels in the $S_2$ image obtained via a first iteration.

12. An apparatus for eliminating motion artifacts in magnetic resonance imaging, comprising:
   a sampling unit, configured to obtain fully-sampled initial K-space data corresponding to a plurality of channels;
   a $K_1$-space obtaining unit coupled to the sampling unit, configured to calculate combination coefficients based on the fully-sampled initial K-space data and obtain $K_1$-space data based on the combination coefficients;
   a $S_{2'}$ image obtaining unit coupled to the $K_1$-space obtaining unit, configured to obtain $K_2$-space data based on the initial K-space data and the $K_1$-space data, obtain a $S_2$ image by transforming the $K_2$-space data to an image domain, and obtain a $S_{2'}$ image by extracting part of the errors caused during the step of obtaining of the $K_1$-space data;
   a $K_4$-space obtaining unit coupled to the $S_{2'}$ image obtaining unit, configured to obtain $K_3$-space data by transforming the $S_{2'}$ image to K-space domain, and obtain $K_4$-space data based on the $K_3$-space data and the $K_1$-space data;
   an iteration determination unit coupled to the $K_1$-space obtaining unit and the $K_4$-space obtaining unit, configured to determine whether to perform a next iteration operation;
   an image obtaining unit coupled to the iteration determination unit, configured to transform the $K_4$-space data to the image domain to obtain a final image;
   wherein obtaining $K_2$-space data based on the initial K-space data and the $K_1$-space data comprises obtaining $K_2$-space data by subtracting the initial K-space data from the $K_1$-space data.

* * * * *